United States Patent
Lee et al.

(10) Patent No.: US 11,228,012 B2
(45) Date of Patent: Jan. 18, 2022

(54) SELF LIGHT-EMITTING DISPLAY DEVICE

(71) Applicant: LG Display Co., Ltd., Seoul (KR)

(72) Inventors: Seungbum Lee, Gyeonggi-do (KR); Wonrae Kim, Paju-si (KR); Sooin Kim, Seoul (KR); Younghoon Kim, Goyang-si (KR); Jungmin Yoon, Goyang-si (KR); Hyungyu Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 119 days.

(21) Appl. No.: 16/585,199

(22) Filed: Sep. 27, 2019

(65) Prior Publication Data

US 2020/0106041 A1    Apr. 2, 2020

(30) Foreign Application Priority Data

Sep. 28, 2018 (KR) ........................ 10-2018-0115629

(51) Int. Cl.
*H01L 27/32* (2006.01)
*H01L 51/52* (2006.01)
*H01L 51/50* (2006.01)

(52) U.S. Cl.
CPC ........ *H01L 51/5064* (2013.01); *H01L 27/322* (2013.01); *H01L 27/3211* (2013.01);
(Continued)

(58) Field of Classification Search
CPC .............. H01L 27/322; H01L 27/3244; H01L 51/5036; H01L 2251/5323; H01L 27/3246;
(Continued)

(56) References Cited

U.S. PATENT DOCUMENTS 6,121,726 A    9/2000  Codama et al.
6,137,459 A   10/2000  Eida et al.
(Continued)

FOREIGN PATENT DOCUMENTS

CN    105720204 A    6/2016
EP    3 355 357 A1   8/2018
(Continued)

OTHER PUBLICATIONS

Extended European Search Report dated Jan. 29, 2020, issued in corresponding EP Application No. 19200291.
(Continued)

*Primary Examiner* — Mary A Wilczewski
*Assistant Examiner* — Tsz K Chiu
(74) *Attorney, Agent, or Firm* — Morgan, Lewis & Bockius LLP

(57) ABSTRACT

A self light-emitting display device includes a substrate having a circuit board and a color filter pattern on the circuit board. The circuit board includes a driving thin-film transistor. The display device further includes a passivation film above the substrate, a color conversion pattern above the passivation film and overlapping the color filter pattern, and a light-emitting layer above the passivation film and the color conversion pattern. The light emitting layer includes a flat part and a convex part. The convex part is above the color conversion pattern and protrudes convexly relative to the flat part.

16 Claims, 4 Drawing Sheets

(52) U.S. Cl.
CPC ...... H01L 27/3248 (2013.01); H01L 51/5278 (2013.01); *H01L 27/3246* (2013.01); *H01L 2227/32* (2013.01)

(58) Field of Classification Search
CPC ............. H01L 51/5271; H01L 51/5275; H01L 51/5012; H01L 51/5262; H01L 51/525
See application file for complete search history.

(56) References Cited

U.S. PATENT DOCUMENTS

| | | | |
|---|---|---|---|
| 10,229,957 B2 | 3/2019 | Rieger et al. | |
| 2005/0062407 A1 | 3/2005 | Suh et al. | |
| 2005/0093435 A1 | 5/2005 | Suh et al. | |
| 2006/0243989 A1* | 11/2006 | Yamazaki | H01L 51/5253 257/79 |
| 2007/0001588 A1* | 1/2007 | Boroson | H01L 51/5278 313/504 |
| 2007/0222367 A1* | 9/2007 | Hosoda | H01L 27/3213 313/503 |
| 2008/0024402 A1* | 1/2008 | Nishikawa | H05B 33/22 345/82 |
| 2011/0241027 A1* | 10/2011 | Kaneta | H01L 27/3246 257/88 |
| 2014/0319470 A1* | 10/2014 | Kim | H01L 51/5271 257/40 |
| 2015/0318334 A1* | 11/2015 | Kim | H01L 51/56 257/40 |
| 2015/0318339 A1* | 11/2015 | Nakamura | H01L 51/5234 257/98 |
| 2016/0172423 A1* | 6/2016 | Nendai | H01L 51/0005 257/40 |
| 2017/0010712 A1* | 1/2017 | Yoshizumi | G06F 3/0443 |
| 2017/0053973 A1* | 2/2017 | Park | H01L 27/3246 |
| 2017/0059940 A1* | 3/2017 | Kim | G02F 1/133617 |
| 2017/0062528 A1* | 3/2017 | Aoyama | H01L 27/3246 |
| 2018/0006092 A1 | 1/2018 | Rieger et al. | |
| 2019/0131580 A1* | 5/2019 | Youn | H01L 27/3258 |
| 2019/0189698 A1 | 6/2019 | Rieger et al. | |

FOREIGN PATENT DOCUMENTS

| | | |
|---|---|---|
| JP | H10-60427 A | 3/1998 |
| JP | H10-177895 A | 6/1998 |
| JP | H10-241860 A | 9/1998 |
| JP | 2004-158469 A | 6/2004 |
| JP | 2005-100939 A | 4/2005 |
| JP | 2008-059824 A | 3/2008 |
| JP | 2008-066147 A | 3/2008 |
| JP | 2018-510456 A | 4/2018 |
| KR | 10-2017-0019510 A | 2/2017 |
| KR | 10-2017-0138984 A | 12/2017 |
| WO | 2008/120626 A | 10/2008 |

OTHER PUBLICATIONS

Japanese Office Action dated Oct. 6, 2020, issued in corresponding Japanese Patent Application No. 2019-179388.

* cited by examiner

SELF LIGHT-EMITTING DISPLAY DEVICE

CROSS-REFERENCE TO RELATED APPLICATIONS

This application claims priority to and the benefit of Korean Patent Application No. 10-2018-0115629 filed in Korea on Sep. 28, 2018, the disclosure of which is incorporated herein by reference in its entirety.

BACKGROUND

Technical Field

The present disclosure relates to a self light-emitting display device.

Discussion of the Related Art

A display device is a device that can display data visually, such as in the form of an image. In today's information society, there is a growing need for various types of display devices that can display images. A liquid crystal display device (LCD) device and an organic light-emitting diode (OLED) display device have been widely used as such display devices.

The organic light-emitting diode display device (which may also be termed an organic light-emitting device) displays an image using organic light-emitting diodes. The organic light-emitting device is a self light-emitting display device that converts electrical energy into light energy using an organic material. In general, the organic light-emitting device has a structure in which an organic film is disposed between an anode and a cathode. When a driving voltage is supplied between the anode and the cathode, holes are injected through the anode and electrons are injected through the cathode. Thus, the holes and the electrons meet in the organic film and are coupled to each other. Accordingly, excitons are generated, and when the state of the excitons is turned into a floor state, light is emitted.

The organic film may have a structure in which layers including (e.g., consisting of) different materials are stacked to enhance efficiency and safety of the organic light-emitting device. For example, the organic film may include a hole injection layer, a hole transport layer, a light-emitting layer, an electron transport layer, an electron injection layer, and the like.

A display device may include a color filer to display colors. Such a color filter may be an optical component that transmits light in a range of predetermined color wavelengths among light coming from a light source and that absorbs light outside the range of predetermined color wavelengths. For example, the color filter may transmit light in a range of red wavelengths, light in a range of green wavelengths, and light in a range of blue wavelengths, and may absorb light outside the ranges of red wavelengths, green wavelengths and blue wavelengths. Accordingly, the color filter may absorb light except for light in a range of predetermined color wavelengths to be displayed, thereby reducing light transmittance or luminous efficiency.

SUMMARY

Accordingly, the present disclosure is directed to a self light-emitting display device that substantially obviates one or more of the problems due to limitations and disadvantages of the related art.

An aspect of the present disclosure is to provide a self light-emitting display device that may enhance color conversion efficiency.

Another aspect of the present disclosure is to provide a self light-emitting display device that may enhance efficiency of external light extraction.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described, a self light-emitting display device includes a self light-emitting display device, comprising a substrate including a circuit board and a color filter pattern on the circuit board, wherein the circuit board includes a driving thin-film transistor; a passivation film above the substrate; a color conversion pattern above the passivation film and overlapping the color filter pattern; and a light-emitting layer above the passivation film and the color conversion pattern, the light emitting layer including a flat part and a convex part, the convex part above the color conversion pattern and protruding convexly relative to the flat part.

According to another aspect, a display device includes a substrate; a first sub-pixel on the substrate and including a first light-emitting device and a first color filter overlapping a first color converter, wherein the first color converter includes a first color conversion material and has tapered edges, and the first light-emitting device is on the first color converter.

In the self light-emitting display device according to embodiments of the present disclosure, the color conversion pattern may be disposed above a passivation film. Accordingly, the color conversion pattern may be designed to be thick, and color conversion efficiency may thereby improve.

In the self light-emitting display device according to embodiments of the present disclosure, the color conversion pattern may be formed after forming a contact hole in the passivation film. Accordingly, the uniformity of contact holes of the sub-pixels may improve. Thus, the self light-emitting display device may reduce and/or minimize a decrease in the electric feature of the anode, which may occur due to lack of uniformity of the contact holes of the sub-pixels.

In the self light-emitting display device according to embodiments of the present disclosure, the sub-pixel may be lens-shaped by a tapered shape of the color conversion pattern. Thus, efficiency of external light extraction may be improved.

Effects of embodiments of the present disclosure are not limited to the effects that have been described above. Other various effects may be included in embodiments of the present disclosure.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION

Figure 1:
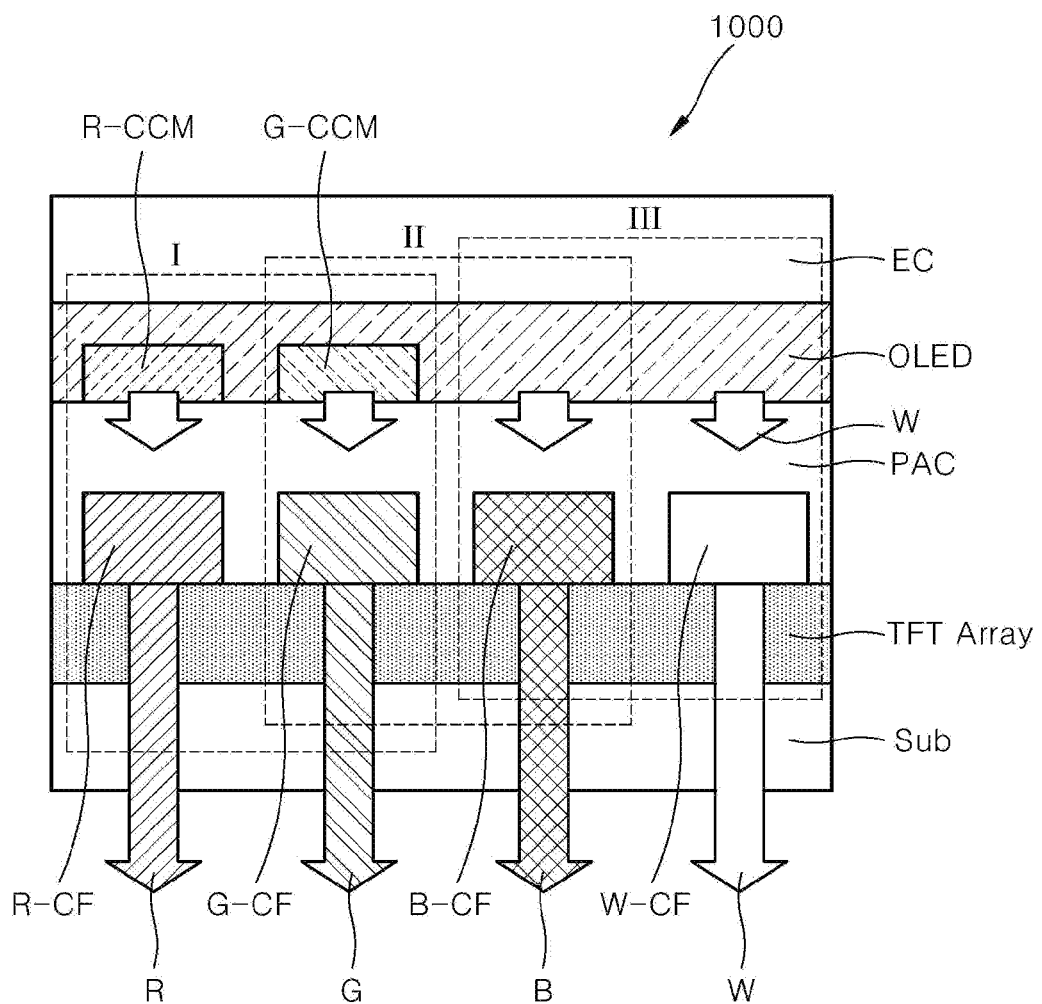
FIG. 1 illustrates a self light-emitting display device according to an embodiment of the present disclosure.

Reference will now be made in detail to embodiments of the present disclosure, examples of which are illustrated in the accompanying drawings.

Advantages and features of the present disclosure, and methods for implementing the same may be understood clearly by reference to the following description of embodiments and experimental examples together with the attached drawings. The attached drawings are provided so that the technical spirit of the present disclosure can be readily understood. Therefore, the technical spirit should not be construed as being limited to the attached drawings.

Additionally, the inventive subject matter may be embodied in various different forms. Accordingly, the disclosure should not be construed as being limited to what is disclosed below. Rather, what is disclosed below is presented so that the disclosure can be thorough and complete and can fully convey the scope of the inventive subject matter to one having ordinary skill in the art. The present disclosure should be defined only according to the scope of the appended claims.

Detailed description of relevant technologies that are publicly known may be omitted if it is deemed to make the gist of the present disclosure unnecessarily vague.

The terms "first," "second" and the like are used herein to describe various elements. However, the terms are used only to distinguish one element from another element. Thus, the elements should not be limited by the terms. Unless otherwise described, a first element may be a second element.

Throughout the specification, the singular forms 'a,' "an," and "the" are intended to include the plural forms as well, unless otherwise described.

Throughout the specification, the terms "including," and "having," should imply the inclusion of any other element but not the exclusion of any other element, unless otherwise described.

Throughout the specification, the terms "A and/or B" imply A, B, or A and B, and the terms "C to D" imply C or more and D or less, unless otherwise described.

When an element or a layer is referred to as being "on" another element or "on" another layer, an element or a layer may be "directly on" or "right on" another element or another layer, and a third element or a third layer may be interposed between an element and another element or between a layer and another layer. However, when an element or a layer is referred to as being "directly on" another element or another layer, or being "right on" another element or another layer, a third element or a third layer is not interposed between an element and another element or between a layer and another layer.

Spacial terms such as "below," "beneath," "lower," "above," "upper" and the like may be used to readily describe a relationship between one element or elements and another element or elements, as illustrated in the drawings.

Additionally, the spacial terms should be interpreted as including different directions in which the elements are used or operate in addition to the directions in the drawings.

FIG. 1 illustrates a self light-emitting display device 1000 according to an embodiment of the present disclosure.

The self light-emitting display device 1000 includes a display area in which each of the pixels is arranged in a matrix form, and a non-display area that is disposed around the display area. The display area is an area in which an image or information, generated in the self light-emitting display device 1000, is visible to a viewer. The non-display area is an area in which an image or information, generated in the self light-emitting display device 1000, is not visible to a viewer, and may be generally referred to as a bezel area.

The self light-emitting display device 1000 includes a plurality of pixels. FIG. 1 illustrates a single pixel among the plurality of pixels that are provided in the self light-emitting display device 1000.

A pixel may be divided into sub-pixels. The sub-pixels may be classified into a first sub-pixel, a second sub-pixel, a third sub-pixel, and a fourth sub-pixel. For example, the first sub-pixel may be a red pixel, the second sub-pixel may be a green pixel, the third sub-pixel may be a blue pixel, and the fourth sub-pixel may be a white pixel.

For each pixel, the self light-emitting display device 1000 includes an upper encapsulation layer (EC), an organic light-emitting device such as an organic light-emitting diode (OLED), and a lower substrate. The organic light-emitting diode (OLED) is disposed between the upper encapsulation layer (EC) and the lower substrate. The lower substrate includes a COT (a color filter on a thin film transistor) substrate, a passivation film (PAC) that is disposed above the COT substrate, and a color conversion pattern.

The COT substrate includes a circuit board and a color filter pattern that is disposed above the circuit board. The circuit board includes a substrate (Sub) and a thin-film transistor array (TFT Array) that is disposed above the substrate (Sub). The color filter pattern is disposed above the thin-film transistor array (TFT Array).

The passivation film (PAC) is disposed above the COT substrate and is disposed between the organic light-emitting diode (OLED) and the COT substrate. The color conversion pattern is disposed above the passivation film (PAC) and overlapped with the color filter pattern.

The color filter pattern includes a first color filter unit (R-CF), a second color filter unit (G-CF), a third color filter unit (B-CF), and a fourth color filter unit (W-CF). For example, the first color filter unit (R-CF) may be a red filter unit that is disposed in a red sub-pixel, the second color filter unit (G-CF) may be a green filter unit that is disposed in a green sub-pixel, the third color filter unit (B-CF) may be a blue filter unit that is disposed in a blue sub-pixel, and the fourth color filter unit (W-CF) may be a white filter unit that is disposed in a white sub-pixel.

For the example where the first color filter unit (R-CF) is a red filter unit that is disposed in a red sub-pixel, that the second color filter unit (G-CF) is a green filter unit that is disposed in a green sub-pixel, and that the third color filter unit (B-CF) is a blue filter unit that is disposed in a blue sub-pixel, the first color filter unit (R-CF), the second color filter unit (G-CF), and the third color filter unit (B-CF) are described below.

The first color filter unit (R-CF) may only transmit light in a range of red wavelengths and for example, absorbs light in ranges of green wavelengths and blue wavelengths. The first color filter unit (R-CF) includes red pigment. The red pigment is not restricted. For example, the red pigment may be C.I. pigment red 177, C.I. pigment red 254, C.I. pigment red 7, C.I. pigment red 9, C.I. pigment red 14, C.I. pigment red 41, C.I. pigment red 81, C.I. pigment red 97, C.I. pigment red 122, C.I. pigment red 123, C.I. pigment red 146, C.I. pigment red 149, C.I. pigment red 155, C.I. pigment red 166, C.I. pigment red 168, C.I. pigment red 169, C.I. pigment red 176, C.I. pigment red 178, C.I. pigment red 180, C.I. pigment red 184, C.I. pigment red 185, C.I. pigment red 187, C.I. pigment red 192, C.I. pigment red 200, C.I. pigment red 220, C.I. pigment red 223, C.I. pigment red 224, C.I. pigment red 226, C.I. pigment red 227, C.I. pigment red 228, C.I. pigment red 240, C.I. pigment red 242, C.I. pigment red 246, C.I. pigment red 255, C.I. pigment red 264, C.I. pigment red 270, C.I. pigment red 272, C.I. pigment red 273, C.I. pigment red 276, or C.I. pigment red 277 and the like.

The second color filter unit (G-CF) may only transmit light in a range of green wavelengths and for example, absorbs light in ranges of red wavelengths and blue wavelengths. The second color filter unit (G-CF) includes green pigment. The green pigment is not restricted. For example, the green pigment may be a phthalocyanine-based compound such as C.I. pigment green 7, or C.I. pigment green PG36, and the like.

The third color filter unit (B-CF) may only transmit light in a range of blue wavelengths and for example, absorbs light in ranges of red wavelengths and green wavelengths. The third color filter unit (B-CF) includes blue pigment. The blue pigment is not restricted. For example, the blue pigment may be C.I. pigment blue 15, C.I. pigment blue 15:1, C.I. pigment blue 15:2, C.I. pigment blue 15:3, C.I. pigment blue 15:4, C.I. pigment blue 15:6, C.I. pigment blue 16, C.I. pigment blue 22, C.I. pigment blue 60, or C.I. pigment blue 64, and the like.

The passivation film (PAC) may be a single film, and may flatten a surface of the COT substrate and may include first parts that are disposed above the color filter pattern, and second parts that are disposed above the thin-film transistor array (TFT Array). The first parts may connect with the second parts, and at least one of the first parts may be disposed between the second parts.

The color conversion pattern is disposed above the passivation film (PAC). In an example, the color conversion pattern may include (e.g., consist of) a first color conversion unit (R-CCM) that is disposed to be overlapped with the first color filter unit (R-CF), and a second color conversion unit (G-CCM) that is disposed to be overlapped with the second color filter unit (G-CF). For example, the first color conversion unit (R-CCM) may be a red conversion unit that is disposed in a red sub-pixel and that converts input light into light in a range of red wavelengths, e.g., red light, and the second color conversion unit (G-CCM) may be a green conversion unit that is disposed in a green sub-pixel and that converts input light into light in a range of green wavelengths, e.g., green light.

The first color conversion unit (R-CCM) and the second color conversion unit (G-CCM) include color conversion materials. The color conversion materials, for example, may be quantum dots, fluorescent dyes, or a combination thereof. The fluorescent dyes, for example, include organic fluorescent materials, inorganic fluorescent materials, and a combination thereof.

The quantum dot may be selected from II-VI compounds, III-V compounds, IV-VI compounds, IV elements, IV compounds, and a combination thereof but is not restricted thereto. II-VI compounds may be selected from a group consisting of a binary compound that is selected from a group consisting of CdSe, CdTe, ZnS, ZnSe, ZnTe, ZnO, HgS, HgSe, HgTe, MgSe, MgS, and a combination thereof; a ternary compound that is selected from a group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary compound that is selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof. III-V compounds may be selected from a group consisting of a binary compound that is selected from a group consisting of GaN, GaP, GaAs, GaSb, AlN, AlP, AlAs, AlSb, InN, InP, InAs, InSb, and a combination thereof; a ternary compound that is selected from a group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof; and a quaternary compound that is selected from a group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. IV-VI compounds may be selected from a group consisting of a binary compound that is selected from a group consisting of SnS, SnSe, SnTe, PbS, PbSe, PbTe, and a combination thereof; a ternary compound that is selected from a group consisting of SnSeS, SnSeTe, SnSTe, PbSeS, PbSeTe, PbSTe, SnPbS, SnPbSe, SnPbTe, and a combination thereof; and a quaternary compound that is selected from a group consisting of SnPbSSe, SnPbSeTe, SnPbSTe, and a combination thereof. IV elements may be selected from a group consisting of Si, Ge, and a combination thereof. IV compounds may be a binary compound that is selected from a group consisting of SiC, SiGe, and a combination thereof.

In an example, a particle may include a uniform concentration of the binary compound, the ternary compound, or the quaternary compound, or may include a different concentration of the binary compound, the ternary compound, or the quaternary compound. The quantum dot may have a core/shell structure in which one quantum dot encircles another quantum dot. Interfaces of the core and shell may have a concentration gradient in which a concentration of elements becomes lower from the shell toward the core.

The quantum dot may have full width at half maximum (FWHM) of an emission spectrum, which is about 45 nm or less, and in one example is about 40 nm or less, and in a more specific example is about 30 nm or less. In this range, color purity and/or color reproduction may improve. Additionally, light that is emitted through the quantum dot may be released in all directions. Accordingly, a range of light viewing angles may be expanded.

The type of quantum dot is not restricted in embodiments of the present disclosure. For example, the quantum dots may be any one of spherical quantum dots, pyramid-shaped quantum dots, and multi-arm quantum dots, or may be any one of cube-shaped nano particles, nano tube-shaped particles, nano wire-shaped particles, nano fiber-shaped particles, or nano plate-shaped particles.

The fluorescent dyes, for example, may be red fluorescent dyes, green fluorescent dyes, dyes that emit a third color light, or a combination thereof. The red fluorescent dyes are a material that absorbs light in a range of green wavelengths and that emits light in a range of red wavelengths. The red fluorescent dyes, for example, may be at least one of (Ca, Sr, Ba)S, (Ca, Sr, Ba)2Si5N8, CaAlSiN3, CaMoO4, Eu2Si5N8. The green fluorescent dyes are a material that absorbs light in a range of blue wavelengths and that emits light in a range of green wavelengths. The green fluorescent dyes, for example, may be at least one of yttrium aluminum garnet (YAG), (Ca, Sr, Ba)2SiO4, SrGa2S4, barium magnesium aluminate (BMA), α-SiAlON, β-SiAlON, Ca3Sc2Si3O12, Tb3Al5O12, BaSiO4, CaAlSiON, (Sr1-xBax)Si2O2N2.

The organic light-emitting diode (OLED) is disposed above the lower substrate and in an example, may include a partial region that is disposed above the color conversion pattern and another partial region that is disposed above the passivation film (PAC). The upper encapsulation layer (EC) is disposed above the organic light-emitting diode (OLED), may prevent external moisture or external air and the like from coming into the organic light-emitting diode (OLED), and may protect the organic light-emitting diode (OLED) from external impact.

The organic light-emitting diode (OLED) outputs white light (W). The color conversion pattern converts short-wavelength light among input white light into long-wavelength light and outputs the long-wavelength light. The long-wavelength light that is output from the color conversion pattern is input to the color filter pattern, and the color filter pattern may only transmit light in a range of specific wavelengths among the input light optionally and absorb light outside the range of specific wavelengths. The self light-emitting display device 1000 may implement colors using light that passes through the color filter pattern.

In a red sub-pixel, white light (W) may be output as red light (R) in the self light-emitting display device 1000 via the first color conversion unit (R-CCM), the passivation film (PAC), and the red filer unit (R-CF) in that order. In a green sub-pixel, white light (W) may be output as green light (G) in the self light-emitting display device 1000 via the second color conversion unit (G-CCM), the passivation film (PAC), and the green filer unit (G-CF) in that order. In a blue sub-pixel, white light (W) may be output as blue light (B) in the self light-emitting display device 1000 via the passivation film (PAC) and the third color filer unit (B-CF). In a white pixel, white light (W) may be output as white light (W) in the self light-emitting display device 1000 via the passivation film (PAC) and the fourth color filer unit (W-CF).

The first color conversion unit (R-CCM) converts a part of input white light (W) into red light (R) and outputs the red light (R) to the first color filter unit (R-CF), and the first color filter unit (R-CF) may only transmit red light (R) among input light. Accordingly, the self light-emitting display device 1000 may implement a red color. The second color conversion unit (G-CCM) converts a part of input white light (W) into green light (G) and outputs the green light (G) to the second color filter unit (G-CF), and the second color filter unit (G-CF) may only transmit green light (G) among input light. Accordingly, the self light-emitting display device 1000 may implement a green color.

The third color filter unit (B-CF) only transmits blue light (B) among input white light (W). Accordingly, the self light-emitting display device 1000 may implement a blue color. The fourth color filter unit (W-CF) transmits input white light (W).

Figure 2:
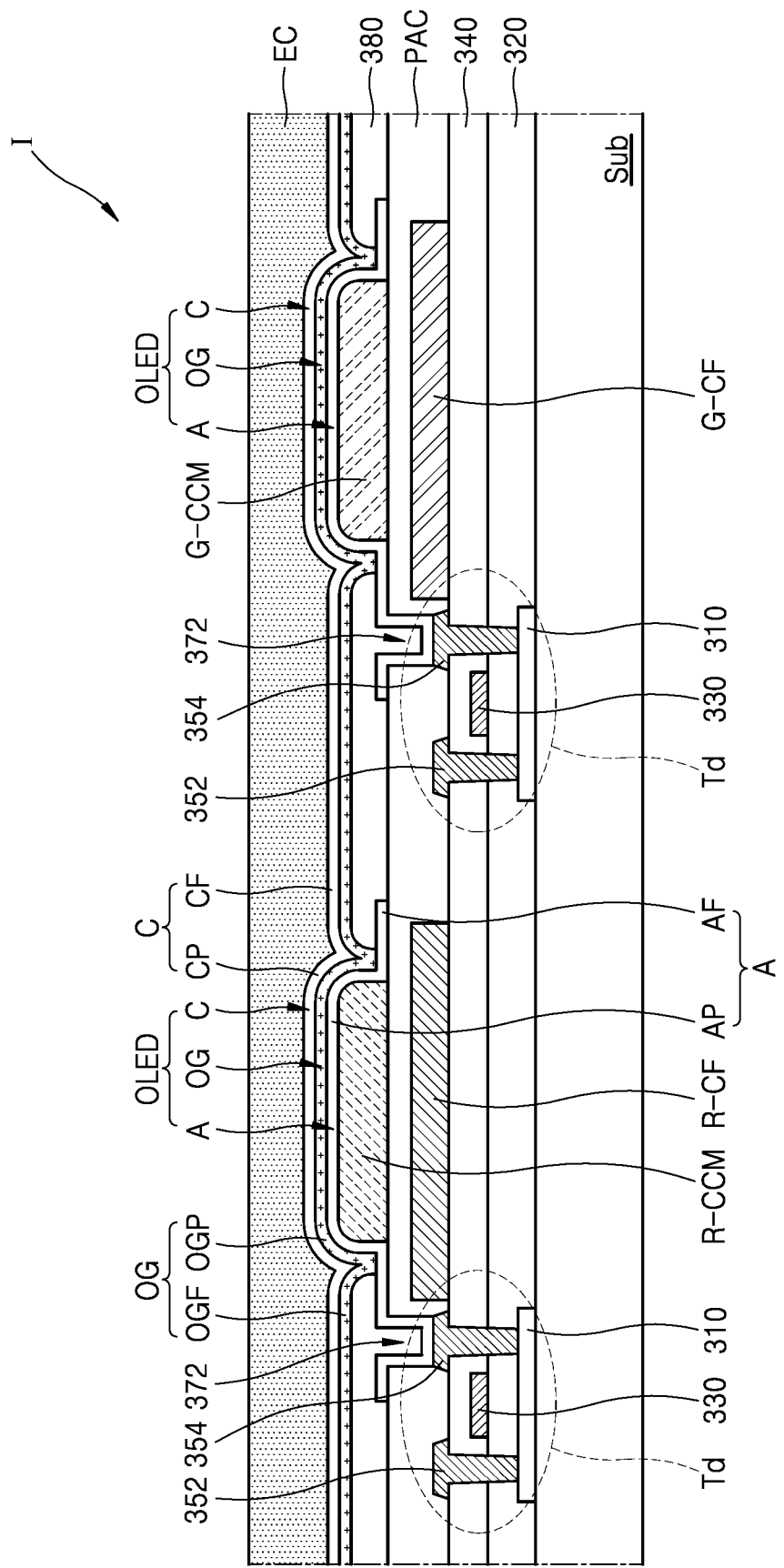
FIG. 2 is a cross-sectional view illustrating region I of FIG. 1.

FIG. 2 is a cross-sectional view illustrating region I of FIG. 1.

With reference to FIG. 2, an organic light-emitting diode (OLED) electrically connects with a driving thin-film transistor (Td) and emits light. The organic light-emitting diode (OLED) includes an anode (A), a cathode (C), and an organic film (OG). The organic film (OG) is disposed between the anode (A) and the cathode (C).

A first color filter unit (R-CF) and a second color filter unit (G-CF) are disposed above a circuit board, and a passivation film (PAC) is disposed above a COT (a color filter on a thin film transistor) substrate. A first color conversion unit (R-CCM) and a second color conversion unit (G-CCM) are disposed above the passivation film (PAC). The first color conversion unit (R-CCM) is disposed to be overlapped with the first color filter unit (R-CF), and the second color conversion unit (G-CCM) is disposed to be overlapped with the second color filter unit (G-CF).

First parts of the passivation film (PAC) are interposed between the first color conversion unit (R-CCM) and the first color filter unit (R-CF), and between the second color conversion unit (G-CCM) and the second color filter unit (G-CF). A contact hole 372 may be provided in second parts of the passivation film (PAC).

In the red sub-pixel, the anode (A) may include a first part (AF) that is disposed above the passivation film (PAC), and a second part (AP) that is disposed above the first color conversion unit (R-CCM). The first part (AF) of the anode (A) may electrically connect with the driving thin-film transistor (Td) through the contact hole 372. The second part (AP) of the anode (A) is formed along a surface of the first color conversion unit (R-CCM) and protrudes convexly with respect to the first part (AF).

In the green pixel, the anode (A) may include a first part (AF) that is disposed above the passivation film (PAC), and a second part (AP) that is disposed above the second color conversion unit (G-CCM). The first part (AF) of the anode (A) may electrically connect with the driving thin-film transistor (Td) through the contact hole 372. The second part (AP) of the anode (A) is formed along a surface of the second color conversion unit (G-CCM) and protrudes convexly with respect to the first part (AF).

A pixel defining film 380 may be configured to divide the sub-pixels. The pixel defining film 380 may be disposed above the passivation film (PAC). Further, the pixel defining film 380 may be disposed above the first part (AF) of the anode (A) and cover the driving thin-film transistor (Td). A flattening part (OGF) of the organic film (OG) may be disposed above the pixel defining film 380. The pixel defining film 380 covers an edge of the anode (A). The pixel defining film 380 may be patterned so that a part of the anode (A) can be exposed, and the organic film (OG) may be disposed in the part of the pixel defining film 380 that is patterned so that a part of the anode (A) is exposed.

In the red sub-pixel and the green sub-pixel, the organic film (OG) and the cathode (C) that are sequentially disposed above the anode (A) have a flattening part (CF) and a convex part (CP) that protrudes convexly with respect to the flattening part (CF), respectively. The convex parts (OGP, CP) of the organic film (OG) and the cathode (C) are formed along a surface of the second part (AP) of the anode (A). The flattening part (OGF) of the organic film (OG) and the flattening part (CF) of the cathode (C) are sequentially formed above the pixel defining film 380. The convex part (OGP) of the organic film (OG) and the convex part (CP) of the cathode (C) are sequentially formed above the second part (AP) of the anode (A). A part of the flattening part (OGF) of the organic film (OG), and a part of the flattening part (CF) of the cathode (C) may be overlapped with the second parts of the passivation film (PAC).

The self light-emitting display device 1000 has a bottom emission-type structure in which an image is implemented in a direction of the anode (A). The anode (A) may include light-transmitting electrodes, and the cathode (C) may include reflective electrodes. The light-transmitting electrodes, for example, may include (e.g., consist of) light-transmitting metal oxides such as ITO, IZO, ZnO and the like, and the reflective electrodes, for example, may include (e.g., consist of) metal such as Ag, Mg, Al, Pt, Pd, Au, Ni, Nd, Ir, Cr, Li, Ca, and the like.

The organic film (OG) includes a hole transport layer (not shown), a light-emitting layer (not shown), and an electron transport layer (not shown). The hole transport layer is disposed between the anode (A) and the light-emitting layer, the light-emitting layer is disposed between the hole transport layer and the electron transport layer, and the electron transport layer is disposed between the light-emitting layer and the cathode (C). The organic film (OG) may further include a hole injection layer (not shown). In this example, the hole injection layer may be disposed between the anode (A) and the hole transport layer. The organic film (OG) may further include an electron injection layer (invisible). In this example, the electron injection layer may be disposed between the electron transport layer and the cathode (C).

The hole injection layer may allow holes to be smoothly injected from the anode (A) into the light-emitting layer, and for example, may include at least one of HAT-CN, CuPu (cupper phthalocyanine), PEDOT(poly(3,4)-ethylenedioxythiophene), PEDOT:PSS(poly(3,4)-ethylenedioxythiophene) poly(styrenesulfonate)), PANI(polyaniline), and NPD(N,N-dinaphthyl-N,N'-diphenyl benzidine).

The hole transport layer may allow the holes to be smoothly transported, and for example, may include at least one of NPD(N,Ndinaphthyl-N,N'-diphenylbenzidine), TPD (N,N'-bis-(3-methylphenyl)-N,N'-bis-(phenyl)-benzidine), s-TAD and MTDATA(4,4',4''-Tris(N-3-methylphenyl-N-phenyl-amino)-triphenylamine).

The light-emitting layer may have a structure in which a red light-emitting layer (not shown), a green light-emitting layer (not shown), and a blue light-emitting layer (not shown) are stacked, or a structure in which a blue light-emitting layer (not shown) and a yellowish green light-emitting layer (not shown) are stacked, and may emit white light.

The electron transport layer may allow electrons to be smoothly transported, and for example, may include at least one of Alq3(tris(8-hydroxyquinolino)aluminum), PBD, TAZ, spiro-PBD, BAlq and SAlq.

The electron injection layer may allow the electrons to be smoothly injected, and for example, may include at least one of Alq3(tris(8-hydroxyquinolino)aluminum), PBD, TAZ, spiro-PBD, BAlq and SAlq.

As discussed above, the circuit board includes a driving thin-film transistor (Td) disposed above a substrate (Sub). Though not illustrated, in the circuit board, a switching thin-film transistor and the like may be further disposed above the substrate (Sub). The substrate (Sub) is a transparent substrate and may be a glass substrate, a transparent polymer resin substrate, or the like. A buffer layer (not shown) may be optionally interposed between the substrate (Sub) and the driving thin-film transistor (Td) to improve flatness of the substrate (Sub). The buffer layer may include (e.g., consist of) inorganic oxides such as a silicon oxide and the like, inorganic nitrides such as a silicon nitride and the like, etc.

The driving thin-film transistor (Td) is disposed above the substrate (Sub) and includes a semiconductor layer 310, a first insulation film 320, a gate electrode 330, a second insulation film 340, a source electrode 352, and a drain electrode 354.

The semiconductor layer 310 is disposed above a first region of the substrate (Sub). The semiconductor layer 310, for example, may include (e.g., consist of) an oxide semiconductor material or may include (e.g., consist of) polycrystalline silicon. When the semiconductor layer 310 includes polycrystalline silicon, the semiconductor layer 310 may include an active layer (not shown) and channel regions (not shown) that are disposed on both side of the active layer.

The first insulation film 320 is disposed between the gate electrode 330 and the substrate (Sub). A part of the first insulation film 320 is disposed above the semiconductor layer 310 in the first region of the substrate (Sub), and another part of the first insulation film 320 is disposed above a second region of the substrate (Sub). The first region of the substrate (Sub) and the second region of the substrate (Sub) are independent regions. The first region of the substrate (Sub) may be defined as a region in which the semiconductor layer 310 is formed. The first insulation film 320 may include (e.g., consist of) inorganic oxides such as a silicon oxide and the like, inorganic nitrides such as a silicon nitride and the like, etc.

The gate electrode 330 is disposed above the first insulation film 320, and is disposed to be overlapped with the semiconductor layer 310 in the first region of the substrate (Sub). The gate electrode 330 may include (e.g., consist of) aluminum-based metal such as aluminum (Al), aluminum alloys and the like, silver-based metal such as silver (Ag), silver alloys and the like, copper-based metal such as copper (Cu), copper alloys and the like, molybdenum-based metal such as molybdenum (Mo), molybdenum alloys and the like, chromium (Cr), titanium (Ti), tantalum (Ta) and the like.

The second insulation film 340 is disposed above the first insulation film 320 and the gate electrode 330. For example, a part of the second insulation film 340 is disposed above the first insulation film 320, and another part of the second insulation film 340 is disposed above the gate electrode 330. Like the first insulation film 320, the second insulation film 340 may include (e.g., consist of) inorganic oxides such as a silicon oxide and the like, inorganic nitrides such as a silicon nitride and the like, etc.

The source electrode 352, the drain electrode 354, the first color filter unit (R-CF), and the second color filter unit (G-CF) are disposed above the second insulation film 340. The source electrode 352 and the drain electrode 354 are spaced apart from each other by the second insulation film 340 in each of the red sub-pixel and the green sub-pixel. In the red sub-pixel, the first color filter unit (R-CF) may be disposed above the second insulation film 340 to be overlapped with the first color conversion unit (R-CCM), and is spaced from the source electrode 352 and the drain electrode 354. In the green sub-pixel, the second color filter unit (G-CF) may be disposed above the second insulation film 340 to be overlapped with the second color conversion unit (G-CCM), and is spaced from the source electrode 352 and the drain electrode 354.

The source electrode 352 and the drain electrode 354 connect with the semiconductor layer 310 through the contact holes that are provided in the first insulation film 320 and the second insulation film 340. The source electrode 352 and the drain electrode 354 may include (e.g., consist of) metal such as Al, Ag, Mg, Mo, Ti, or W, and the like.

An upper encapsulation layer (EC) is disposed above the cathode (C), and may prevent external moisture or external air and the like from coming into the organic film (OG) and also protect the organic film (OG) from an external impact.

Figure 3:
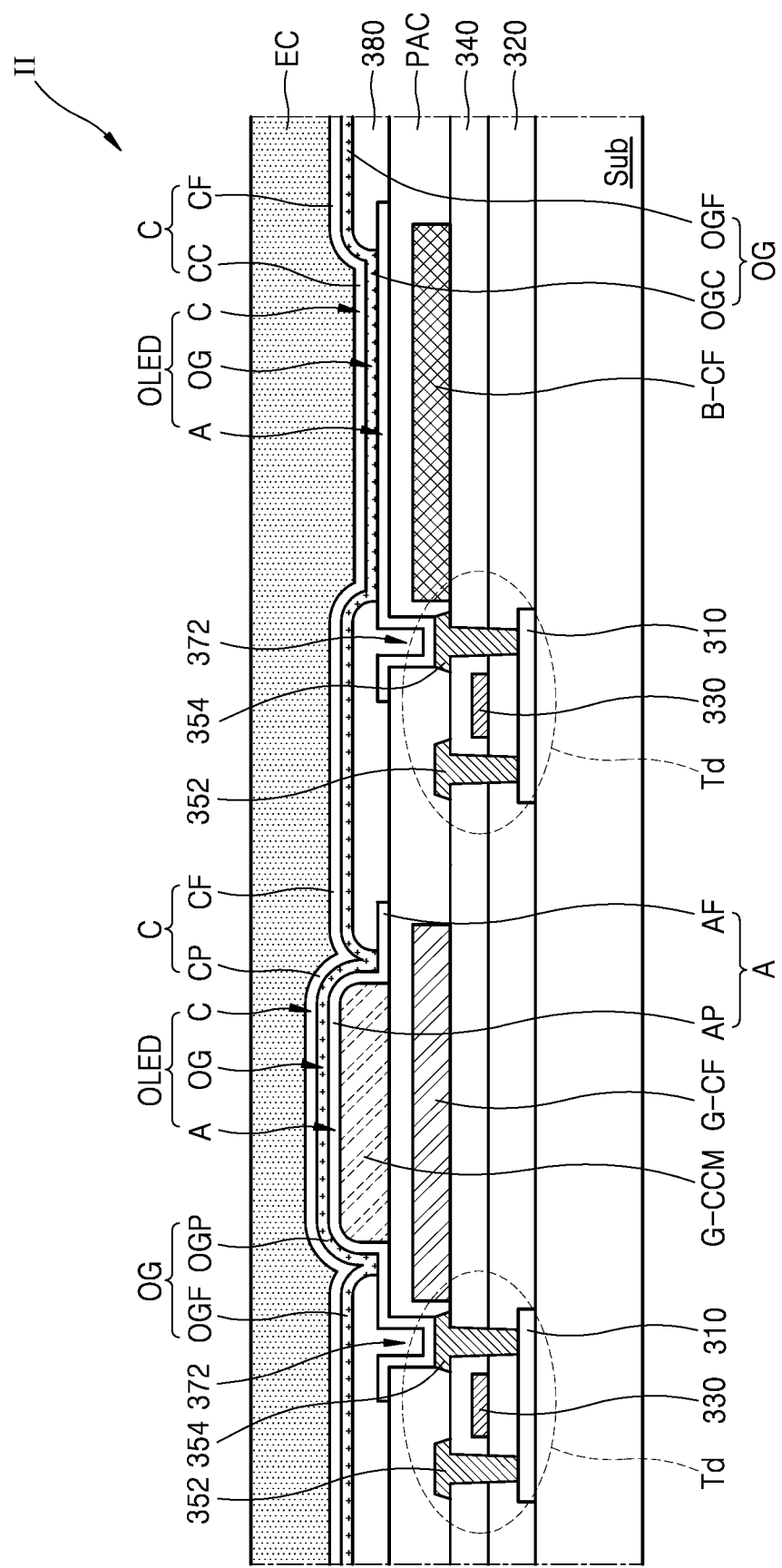
FIG. 3 is a cross-sectional view illustrating region II of FIG. 1.
Figure 4:
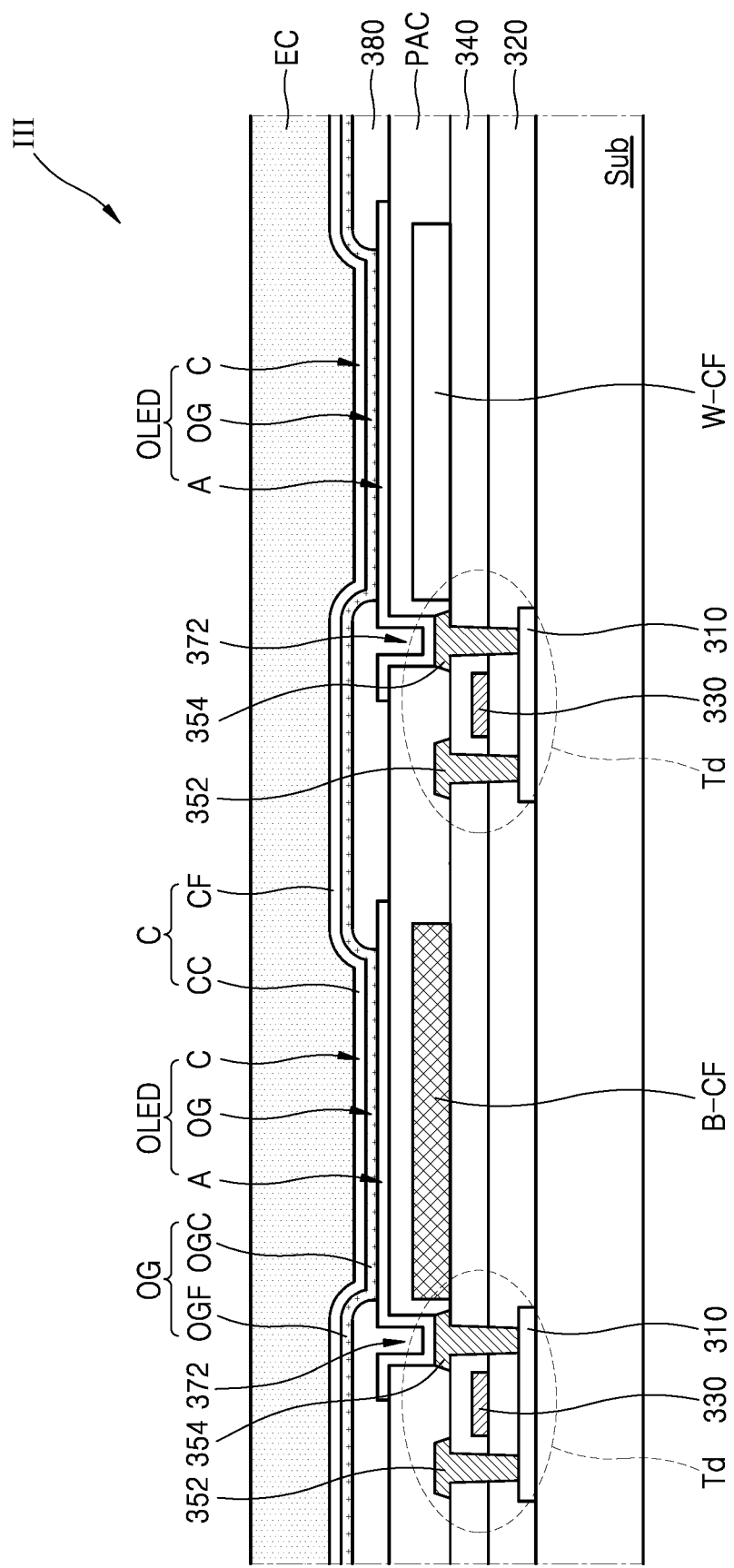
FIG. 4 is a cross-sectional view illustrating region III of FIG. 1.

FIG. 3 is a cross-sectional view illustrating region II in FIG. 1, and FIG. 4 is a cross-sectional view illustrating region III in FIG. 1. Description of the same features that have already been described with reference to FIG. 2 is omitted for brevity. Region II in FIG. 3 illustrates a green sub-pixel and a blue sub-pixel, and region III in FIG. 4 illustrates a blue sub-pixel and a white sub-pixel.

Unlike the red sub-pixel and the green sub-pixel, the blue sub-pixel and the white sub-pixel may not include a color conversion pattern disposed above the passivation film (PAC) to be overlapped with the third color filter unit (B-CF) and the fourth color filter (W-CF).

Unlike the anode (A) of each of the red sub-pixel and the green sub-pixel, the anode (A) of each of the blue sub-pixel and the white sub-pixel may include only a first part (AF) that is a flattening part disposed above the passivation film (PAC). For example, the anode (A) of each of the blue sub-pixel and the white sub-pixel may not include a second part (AP) that protrudes convexly relative to the first part (AF).

Unlike the organic film (OG) of the red sub-pixel and the green sub-pixel, the organic film (OG) of the blue sub-pixel and the white sub-pixel includes a flattening part (OGF) that is disposed above the pixel defining film 380 and a convex part (OGC) that is disposed above the anode (A) to be dug concavely relative to the flattening part (OGF). For example, the organic film (OG) of each of the blue pixel and the white pixel may not include a convex part (OGP) that protrudes convexly relative to the flattening part (OGF).

Unlike the cathode (C) of the red sub-pixel and the green sub-pixel, the cathode (C) of the blue sub-pixel and the white sub-pixel includes (e.g., consists of) a flattening part (CF) and a concave part (CC) that is dug concavely relative to the flattening part (CF). For example, the cathode (C) of each of the blue sub-pixel and the white sub-pixel may not include a convex part (CP) that protrudes convexly relative to the flattening part (CF).

In a structure including the color conversion pattern directly disposed on the color filter pattern and covered by the passivation film, a difference between heights of W, R, G, and B sub-pixels may increase, and thus, the uniformity of holes of the passivation film (PAC) may decrease. As a result, reduction in the electrical feature of the anode may occur.

In the self light-emitting display device 1000 according to embodiments of the present disclosure, a contact hole is formed in the passivation film (PAC), and then a color conversion pattern is formed. Thus, a lack of uniformity of contact holes among sub-pixels may be prevented. Additionally, in the self light-emitting display device 1000, a color conversion pattern is disposed above the passivation film (PAC). Accordingly, a thick color conversion pattern may be designed. As a result, unlike the above-described structure, the structure of the self light-emitting display device 1000 my lead to an increase in color conversion efficiency.

Further, in the self light-emitting display device 1000, the sub-pixel may become lens-shaped by the tapered shape of the color conversion units (R-CCM, G-CCM). Accordingly, the self light-emitting display device 1000 may improve efficiency of external light extraction.

For example, in the self light-emitting display device 1000, the anode (A) may include a taper-shaped surface corresponding to the tapered shape of the color conversion units (R-CCM, G-CCM). Accordingly, a path of light changes on the taper-shaped surface of the anode (A). As a result, light that is lost as isolated light in the organic film (OG) may be extracted outwards in wave-guided mode because of a difference in the refractive indices of the anode (A) and the organic film (OG).

Furthermore, by the color conversion units (R-CCM, G-CCM), the self light-emitting display device 1000 may prevent light reflected from the taper-shaped surface of the cathode (C) from leaking through lateral surfaces, and thus may concentrate light on the front surface.

Embodiments have been described with reference to the attached drawings. However, the present disclosure is not limited to these embodiments. The disclosure may be modified in various different forms on the basis of a combination of descriptions of each embodiment.

It will be apparent to those skilled in the art that various modifications and variations can be made in the self light-emitting display device of the present disclosure without departing from the spirit or scope of the disclosure. Thus, it is intended that the present disclosure cover the modifications and variations of this disclosure provided they come within the scope of the appended claims and their equivalents.

What is claimed is:

1. A self light-emitting display device, comprising:
    a substrate including:
        a circuit board including a driving thin-film transistor; and
        a color filter pattern on the circuit board;
    a passivation film above the color filter pattern;
    a color conversion pattern above the passivation film, the color conversion pattern overlapping the color filter pattern;
    a light-emitting layer above the passivation film and the color conversion pattern, the light emitting layer including:
        a flat part; and
        a convex part, the convex part covering an entirety of the color conversion pattern, the convex part protruding convexly relative to the flat part; and
    an anode including:
        a first part between the flat part of the light-emitting layer and the passivation film; and
        a second part between the color conversion pattern and the convex part of the light-emitting layer, the second part protruding convexly relative to the first part, the second part directly contacting the color conversion pattern.

2. The self light-emitting display device of claim 1, wherein:
    the passivation film includes a contact hole in a region where the first part and the driving thin-film transistor overlap each other; and
    the anode electrically connects with the driving thin-film transistor through the contact hole.

3. The self light-emitting display device of claim 2, further comprising:
    a pixel defining film configured to divide sub-pixels, disposed above the passivation film, and covering an edge of the anode,
    wherein the flat part is above the pixel defining film.

4. The self light-emitting display device of claim 1, wherein:
    the color filter pattern includes a red filter unit, a green filter unit, and a blue filter unit that are spaced apart from each other; and
    the color conversion pattern includes:
        a red conversion unit that overlaps the red filter unit; and
        a green conversion unit that overlaps the green filter unit.

5. The self light-emitting display device of claim 1, further comprising:
a cathode above the light-emitting layer; and
an encapsulation layer above the cathode.

6. A display device, comprising:
a substrate;
a first sub-pixel on the substrate, the first sub-pixel including:
a first light-emitting device; and
a first color filter overlapping a first color converter, the first color converter including a first color conversion material, the first color converter having upwardly tapered edges;
a passivation film between the first color filter and the first color converter,
wherein the first light-emitting device is on the first color converter and the first color filter, and
wherein the first light-emitting device includes an anode having a first part and a second part, the second part directly contacting the first color converter, the second part protruding convexly relative to the first part.

7. The display device of claim 6, wherein:
the first sub-pixel further includes a driving transistor on the substrate;
the passivation film includes a contact hole where the first part of the anode and the driving thin-film transistor overlap each other; and
wherein the first part of the anode electrically connects to the driving transistor through the contact hole.

8. The display device of claim 6, wherein the first color converter protrudes convexly from the substrate.

9. The display device of claim 6, wherein the first light-emitting device includes a cathode including:
a flat part; and
a convex part that protrudes convexly relative to the flat part, the convex part of the cathode overlapping the first color conversion layer and the first color filter.

10. The display device of claim 9, further comprising a second sub-pixel on the substrate, the second sub-pixel including a second light-emitting device and a second color filter, the second light-emitting device including a cathode including:
a flat part; and
a concave part that sinks concavely relative to the flat part, the concave part of the cathode of the second light-emitting device overlapping the second color filter.

11. The display device of claim 6, further comprising a pixel defining film that overlaps the first part of the anode.

12. The display device of claim 6, wherein the tapered edges of the first color converter protrude convexly relative to the first part of the anode.

13. The display device of claim 10, wherein:
the second light-emitting device includes an anode;
the display device further comprises a passivation film between the second color filter and the anode of the second light-emitting device, the passivation film directly contacting an entirety of the anode of the second light-emitting device that overlaps the second color filter.

14. The display device of claim 10, wherein the second light-emitting device is configured to emit blue light.

15. The display device of claim 6, wherein the first color converter is between the anode and the passivation film, such that the anode is spaced apart from the passivation where the first color converter overlaps the first color filter.

16. The display device of claim 6, wherein the first color converter has the tapered edges, such that the first sub-pixel has a lens shape to thereby improve external light extraction efficiency.

* * * * *